United States Patent [19]

Greiff

[11] Patent Number: 5,111,693

[45] Date of Patent: May 12, 1992

[54] MOTION RESTRAINTS FOR MICROMECHANICAL DEVICES

[75] Inventor: Paul Greiff, Wayland, Mass.

[73] Assignee: The Charles Stark Draper Laboratory, Inc., Cambridge, Mass.

[21] Appl. No.: 560,374

[22] Filed: Jul. 30, 1990

Related U.S. Application Data

[63] Continuation-in-part of Ser. No. 373,032, Jun. 28, 1989, abandoned, Ser. No. 479,854, Feb. 14, 1990, which is a continuation-in-part of Ser. No. 143,515, Jan. 13, 1988, abandoned.

[51] Int. Cl.⁵ .............................................. G01P 15/02
[52] U.S. Cl. ...................... 73/514; 73/505; 73/862.62
[58] Field of Search .................. 73/505, 517 R, 517 A, 73/514, 862.62; 357/25, 26

[56] References Cited

U.S. PATENT DOCUMENTS 3,370,458  2/1968  Dillon ............................. 73/862.62
4,882,933  11/1989  Petersen et al. .................. 73/517 R

FOREIGN PATENT DOCUMENTS 61-144576  7/1986  Japan ............................. 73/517 R

OTHER PUBLICATIONS

Kurt E. Petersen, "Silicon as a Mechanical Material", Proceedings of the IEEE, vol. 70, No. 5, May 1982, pp. 420-457.

M. Nakamura et al., "Novel Electromechanical Micro-Machining and its Application for Semiconductor Acceleration Sensor IC," Digent of Technical Papers (1987), Institute of Electrical Engineers of Japan, pp. 112-115.

L. M. Moskalik, "Tensometric Accelerometers with Overload Protection," Meas. Tech. vol. 22, No. 12, (Dec. 1979), pp. 1469-71.

Primary Examiner—John E. Chapman
Attorney, Agent, or Firm—Weingarten, Schurgin, Gagnebin & Hayes

[57] ABSTRACT

Motion restraints and a method for their fabrication are provided for use with a micromechanical transducer, such as a gyroscope or an accelerometer, to limit the motion of resiliently supported transducer elements, preventing extreme lateral or rotational displacement of the elements. The motion restraints are fabricated of a material such as gold that prevents or reduces the sticking of the transducer elements at points of contact between them. In one embodiment, the motion restraints include cantilevered depositions that extend from the substrate over the transducer element. In a further embodiment, the restraints includes a metal capped post and close-tolerance lateral restraints.

8 Claims, 5 Drawing Sheets

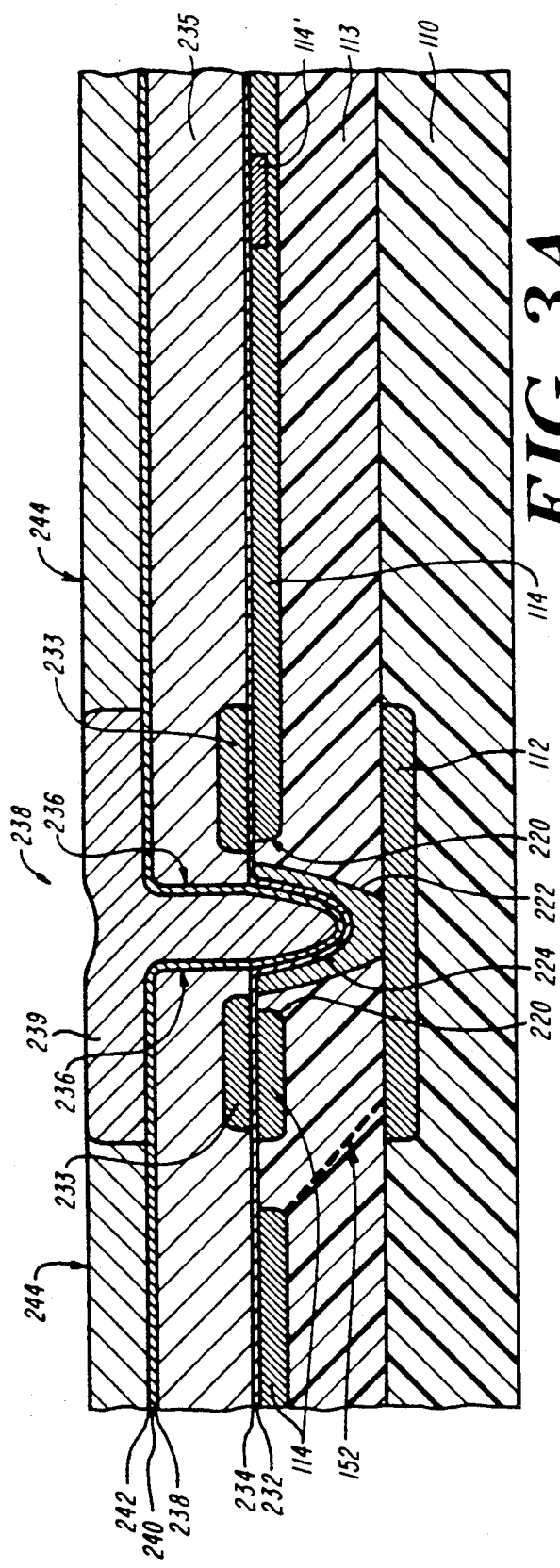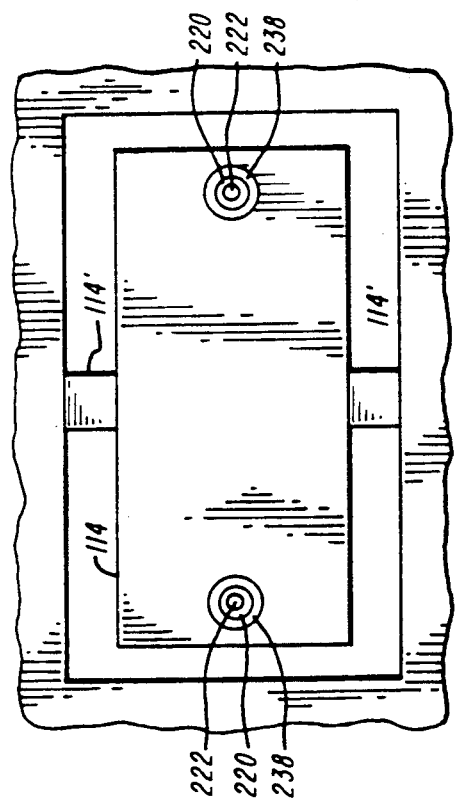

MOTION RESTRAINTS FOR MICROMECHANICAL DEVICES

CROSS REFERENCE TO RELATED APPLICATIONS

The application is a continuation-in-part of copending, commonly assigned application Ser. No. 07/373,032, filed Jun. 28, 1989, now abandoned and is related to commonly assigned application Ser. No. 07/479,854, which is a continuation-in-part of Ser. No. 07/479,854, filed Feb. 14, 1990, which is a continuation-in-part of Ser. No. 07/143,515, filed Jan. 13, 1988, now abandoned.

FIELD OF THE INVENTION

This invention relates to motion restraints for use in conjunction with micromechanical devices.

BACKGROUND OF THE INVENTION

Motion sensitive elements of precision instruments such as micromechanical gyroscopes and accelerometers are easily damaged by high acceleration loads which cause element excursions beyond the normally encountered limits. These loads may induce element jamming of one or more resilient components, introducing an unknown error.

Micromechanical devices have features that are measured in microns, and even entire transducers can be as small as 1000 microns across. On such size scales, the fabrication of motion limits becomes a difficult task.

The silicon material of which micromechanical devices are formed is prone to intersurface contact sticking, due to the extremely low mass of typical moveable elements in such devices. The sticking is sufficient to jam a movable element against a bordering surface. This results in transducer inoperativeness which, if undetected, can result in unacceptable error.

Extreme motions of the movable elements can also induce strains in the resilient restraints such as flexures. These strains produce a bias in the instrument which can also lead to unacceptable error.

SUMMARY OF THE INVENTION

According to the teaching of the present invention, restraints are provided that are integrally formed with microstructure transducers such as gyroscopes or accelerometers, as projections that limit the motion of a resiliently supported transducer element, thereby preventing extreme lateral or rotational displacement and consequent material strain. The restraints also eliminate sticking of the transducer element at the extremes of its motion.

In one embodiment, the restraints are cantilevered metal depositions that extend from a substrate over a resiliently supported transducer element. In another embodiment, the restraints include a post and cap which together provide close-tolerance lateral restraints and rotational limits.

The restraints limit the element motion so as to avoid strains resulting from extremes of motion. Metal platings are utilized for the restraints so that silicon-to-silicon contact is avoided by using a more malleable material, such as gold, that avoids jamming by providing metal-to-metal contact.

Photolithographic processing steps are provided for the fabrication of the system of restraints on a smooth surface of monolithic crystalline silicon.

The invention provides greater reliability and practicality of operation when used in conjunction with a micromechanical transducer.

BRIEF DESCRIPTION OF THE DRAWINGS

The invention will be more fully understood from the following solely exemplary detailed description, in conjunction with the following drawings, in which:

FIGS. 3A and 3B illustrate a second embodiment of the invention having a post and cap formed by a metallization process;

DETAILED DESCRIPTION OF THE INVENTION

Figure 1A:
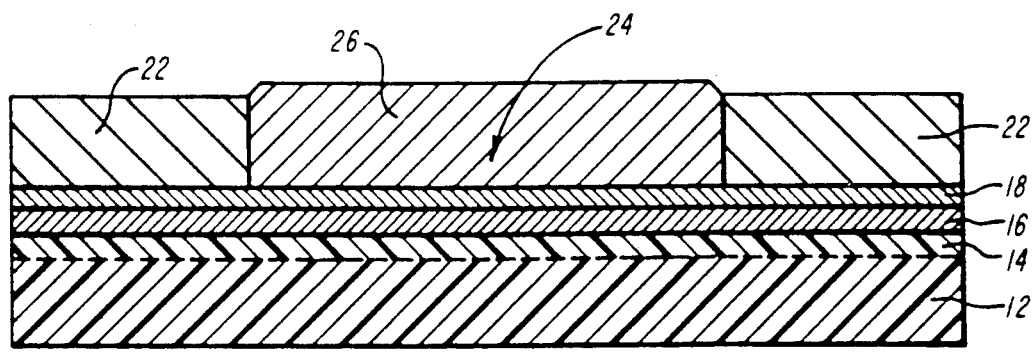
FIGS. 1A, 1B and 1C illustrate the structure and formation in general of multilayer structures.
Figure 1B:
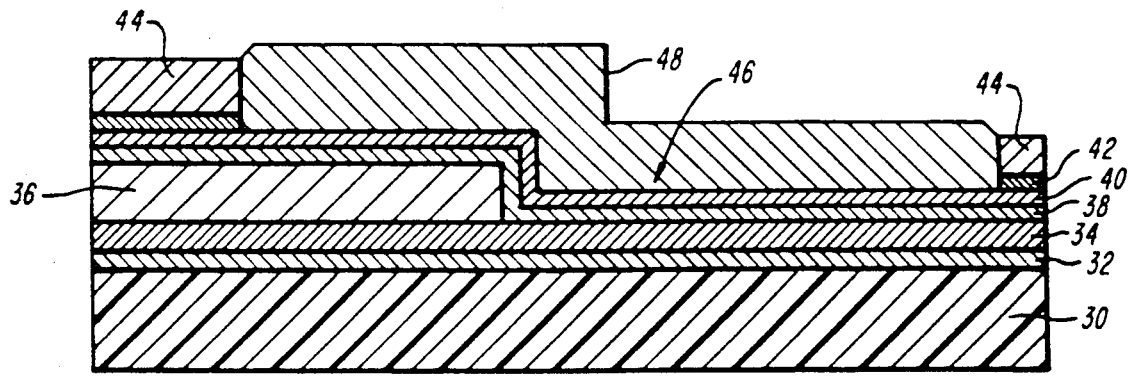

The embodiments of FIGS. 2-5 disclosed herein can be fabricated using one or both of the following first and second general multilayer metal processes of FIGS. 1A to 1B. FIG. 1A shows a layered structure that results from a first general process for the formation of a metal layer over a silicon substrate 12. The silicon layer 12 may be selectively doped to be etch resistant depending upon the application as more fully described below, and may be covered or partially covered with a grown oxide (or other dielectric) layer 14 for purposes of electrical isolation.

To support the metallization layer, a first layer 16 of titanium-tungsten alloy (TiW), approximately 1 micron thick, is applied to the substrate 12 by a vacuum deposition technique. The resulting deposition is then sintered. The TiW layer 16 provides good adhesion to the underlying silicon or dielectric and is sufficiently ductile for the application intended. On top of the TiW layer 16, a gold (Au) layer 18 is deposited in the same vacuum cycle, i.e., a vacuum is maintained between deposition steps. The tungsten (W) in the TiW layer 16 substantially prevents gold from diffusing through to the silicon substrate 12 during sintering. The layer 16 is intended both to provide a site upon which a thicker gold layer 26 is to be electroplated, and as metal runs for providing electrical contact to the site. The composite TiW/Au layer 16/18 is patterned by photolithography, leaving behind gold areas intended to serve as bases for electroplating, metal runs, or bonding pads. The aforementioned resist is removed and a thick layer 22 of resist is applied which is then apertured to expose a hole 24 through which a thick layer 26 of gold is electroplated in a bath, using electrical contact provided by layers 16 and 18. The resist layer 22 is removed and the exposed areas of layer 18 are then selectively removed to leave desired conductive leads, if any.

A second general process for fabricating a thick metallization layer spaced from an underlying silicon layer is described with reference to FIGS. 1B and 1C. Titanium-tungsten and gold layers 32 and 34 are applied to a silicon substrate 30 in the same vacuum deposition step, and layer 34 is selectively etched as described above. Next, a thick layer 36 of photoresist is applied in a region where the final metallization layer is to be elevated above the silicon substrate 30 for purposes to be described below. Over the partial resist layer 36 and TiW/Au layers 32/34, a triple set of layers 38, 40 and 42 of titanium, gold, and titanium are applied using vacuum deposition in the same vacuum cycle. The outer Ti layer 42, used for adhesion of a subsequently applied photoresist layer 44, is apertured by etching a hole or holes 46 to expose the gold layer 40 where a final gold metallization layer 48 is to be applied using an electroplating process. The resist layer 44 is applied and similarly apertured at hole(s) 46. The thick structural gold layer 48 is then electroplated on the gold layer 40 to a thickness of many microns. The resist layers 36 and 44 are then removed along with the uncovered portions of layers 38, 40 and 42 to leave the structure shown in FIG. 2C.

Although the system above has been described with titanium, tungsten and gold, other metals may be used. The alternative metals must provide adhesion between each layer, and permit selective etching and plating, and be sufficiently conductive. A system comprising aluminum and silver satisfies these requirements, and can be used in conjunction with an anisotropic silicon etch that does not attack either metal. Further, alternative systems include vanadium/silver/titanium, titanium/silver/titanium, vanadium/palladium/titanium, vanadium/gold/titanium, titanium/copper/titanium, and titanium/nickel/titanium.

Figure 2A:
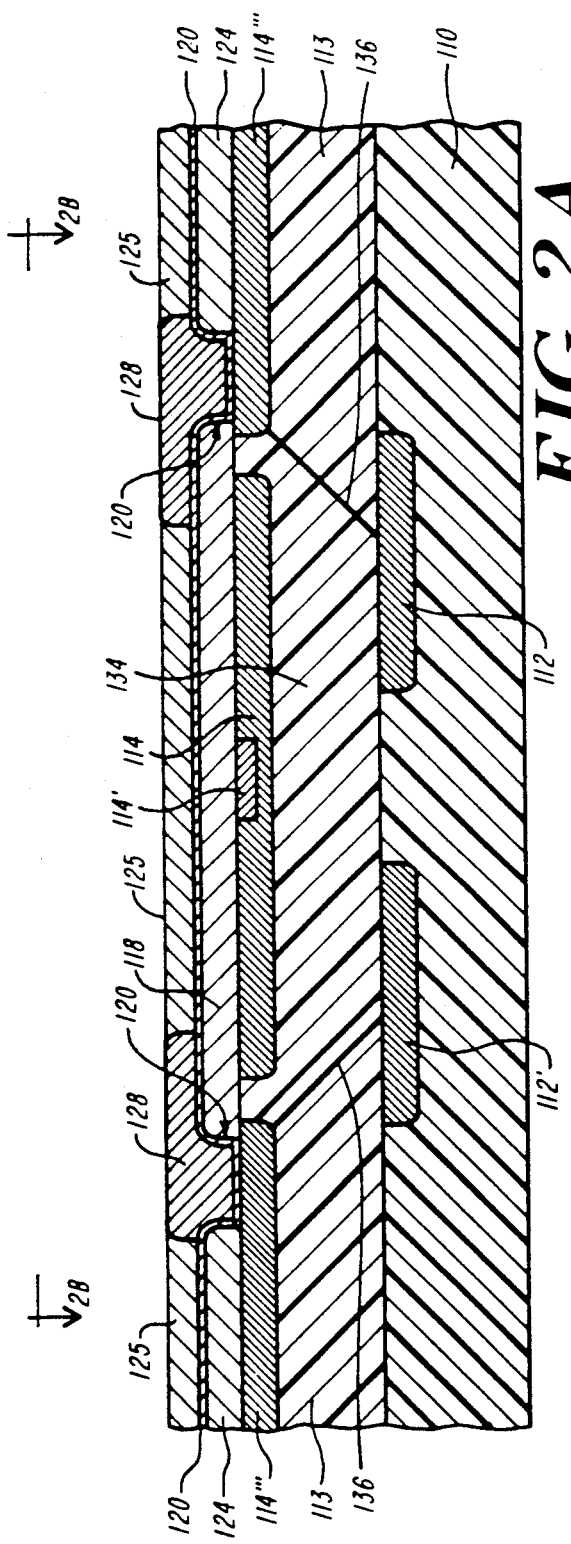
FIGS. 2A and 2B illustrate a first embodiment of the invention having cantilevered restraints.
Figure 2B:
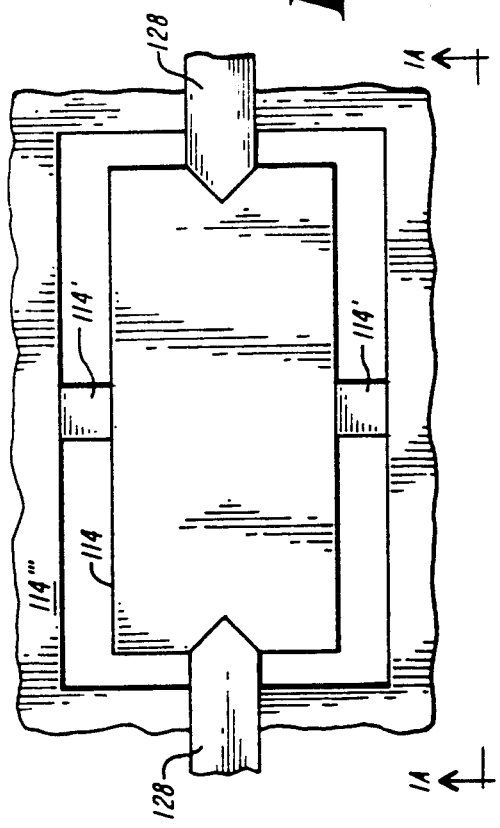
Figure 6A:
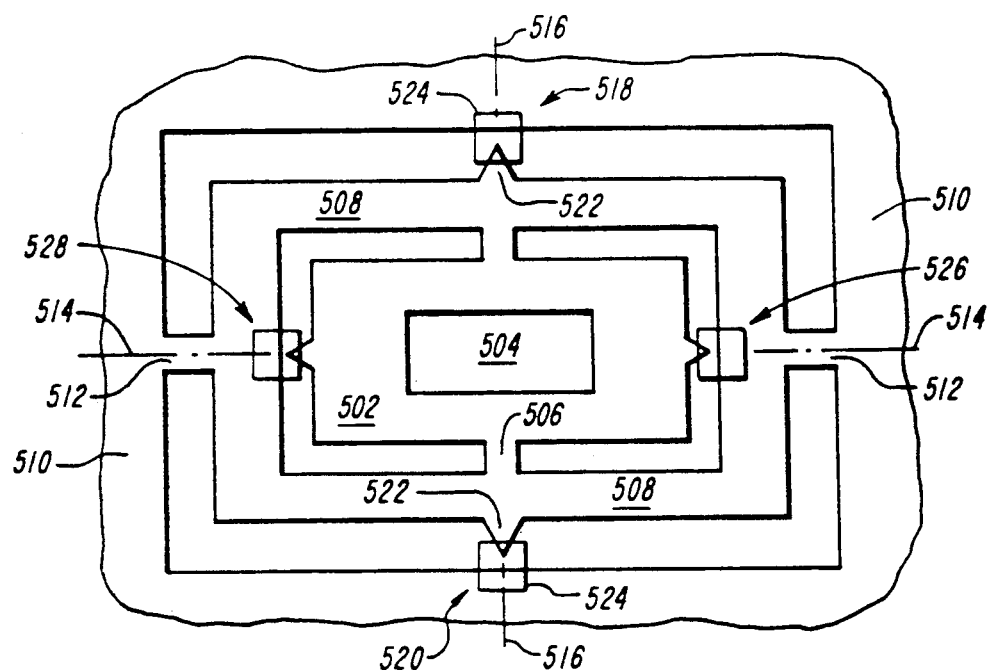
FIGS. 6A and 6B illustrate, in top and perspective views respectively, the application of stops to gyroscope transducers in micromechanical devices.
Figure 6B:
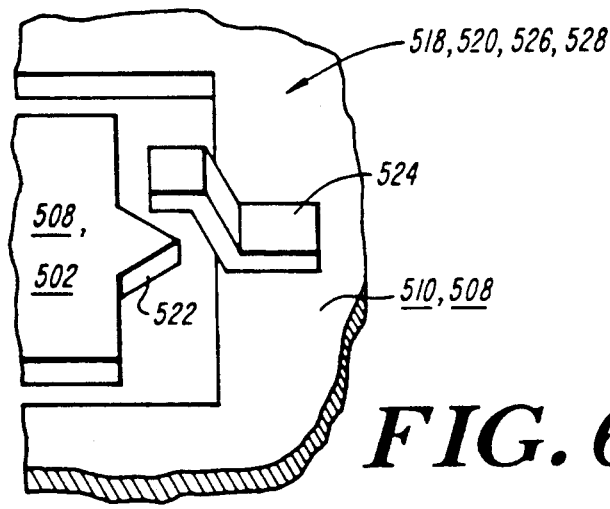
Figure 7:
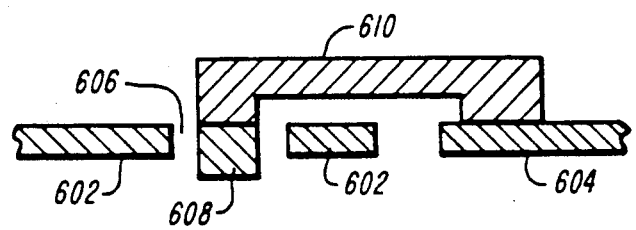
FIG. 7 illustrates a further embodiment of a stop.

The motion restrains of the invention will be described for use with a typical micromechanical accelerometer device as shown in FIGS. 2A and 2B. The invention is not limited to use with only this particular device, as it may be used in conjunction with any micromechanical device such as a micromechanical gyroscope, as illustrated in FIGS. 6A, 6B and 7.

The accelerometer includes a silicon substrate etched in a central region to free and resiliently support a transducer element therein. With reference to FIGS. 2A and 2B, a first embodiment 128 of the motion restraints of the invention operates by projecting over each end of a plate 114 that is suspended by flexures 114' from respective points on the silicon substrate 12.

In order to fabricate the device shown in FIGS. 2A and 2B, an N-type silicon substrate 110 is masked and defused with boron to create P+ buried layers 112 and 112' which serves as buried electrodes. An appropriate and common technique for masking the surface of the silicon wafer includes oxidizing the surface, coating it with a photoresist, exposing it to light, and washing away the uncovered oxidized surface, etching the exposed photoresist in a solution of buffered hydrofluoric acid, and finally removing the resist. The remaining oxide layer serves to limit the diffusion of boron into the silicon substrate 110 to portions 112 and 112'.

Next, an additional layer of silicon 113 is epitaxially grown over the surface of the substrate 110 with a nominal thickness of 10 microns. To create flexures 114' and the plate 114, the layer 113 surface is photolithographically masked and diffused with boron in the regions 114 and 114'. In the present embodiment, the flexures 114' are created in a separate second diffusion step, and which is only one tenth as deep as the for the plate 114. In alternate embodiments, a plate and its flexures can be of the same depth, and so can be created in a single step.

A passivating dielectric layer 124 is next created by thermally oxidizing the surface of the epitaxial layer 113 and then depositing silicon nitride everywhere over the surface using chemical vapor deposition (CVD). The dielectric layer 124 is then masked and etched to expose the surface of the epitaxial layer immediately over and surrounding the plate region 114.

Next, a thick layer of photoresist is applied which is photolithographically processed to form a spacer 118. Then, a thin metal layer 120 is applied, consisting of the separately applied layers of titanium (Ti), gold (Au), and titanium (Ti), each deposited successively while maintaining a substantially constant vacuum environment. The triple metal layer 120 serves three purposes: it functions as a base for subsequent plating, including providing electrical contact, it protects the resist spacer 118 from chemicals used in patterning subsequent layers, and it provides a surface that facilitates good adhesion of a second photoresist layer 125. The second layer of photoresist 125 is applied to the topmost titanium layer and patterned, thereby exposing selected portions of the titanium layer, which is then etched to leave openings therein, exposing the underlying thin gold layer, whereupon the restraint structures 128 are then formed by plating with gold or nickel to a height of about 2-10 microns. Optionally, to where nickel is plated rather than gold, an additional thin layer of gold is electroplated everywhere on the surface of that topmost nickel layer.

Finally, the photoresist 125 is removed with a solvent, the Ti/Au/Ti metal layer 120 is removed (in all areas not covered by the gold layer 128) by etching, the photoresist spacer 118 is removed using a solvent, and the region 134 of the epitaxial layer 113 is anisotropically etched using, for example, ethylenediaminepyrocatechol in water to free the plate 114 and its associated flexures 114'. The anisotropic etch proceeds only to the extent indicated by line 136.

With reference to FIGS. 3A and 3B, a second embodiment includes a motion restraint 238 that projects through each of two holes 220 in a plate 114. The motion restraint 238 includes a cap 239 at the end of a stalk 222 that serves to restrict motion of the respective end of the plate in the direction of the stalk 222. The unit of FIGS. 3A and 3B includes a first substrate 110 of N-type silicon having a photolithographically produced P-type region 112. Thereon an epitaxial layer 113 is grown.

The plate 114 with hole 220 at each end, and flexures 114' supporting it, are fabricated using the same steps as described for use with the restraints above. In that process, and prior to the boron dopings that define elements 114 and 114', a pit 224 is etched through the surface of silicon substrate 113 almost to the diffusion 112. Using photolithographic techniques describe above, a diffusion for the plate 114 provides a diffusion 222 in the pit 224 that contacts the diffusion 112. In a much subsequent step when the plate 114 is freed by etching, the boron to diffusion 222 forms a stalk 222 to support cap 39.

Figure 1C:
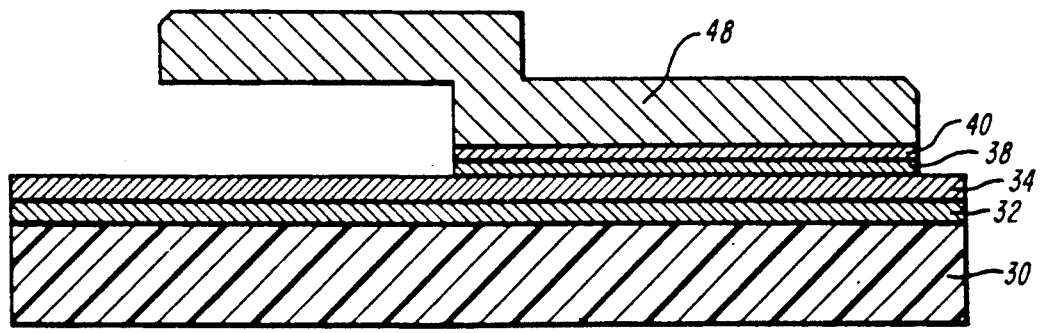

The cap 238 is formed, using the second general process illustrated in FIG. 1C., as a thick metallization layer 239 spaced from underlying silicon layer 113. In particular, metal layers 232 and 234 of titanium/tungsten and gold are deposited. Next, a layer 235 of resist is deposited and patterned to leave a substantially round hole centered on the pit 224. Then, three metal layers 238, 240, 242 of Ti/Au/Ti are deposited over layer 235 and into the pit 224. The topmost titanium layer 242 is etched using a thick layer of resist 244 as a mask. The upper portion of the cap 239 is then electroplated using a gold (or nickel) electroplating, for example.

In the preferred embodiment of FIGS. 3A and 3B, there is further included a non-stick annular pad 233 disposed around hole 220 in the plate 114 which further limits the plate 114 from sticking to the cap 239. To fabricate this embodiment, prior to depositing the layer 236 of resist, a non-stick material, such as tetrafluoroethelene, is deposited on the plate 114 in annular pattern 233 around each hole 220. The annular pattern 233 has an inner diameter slightly smaller than the diameter of the corresponding hole 220 it surrounds.

Figure 4:
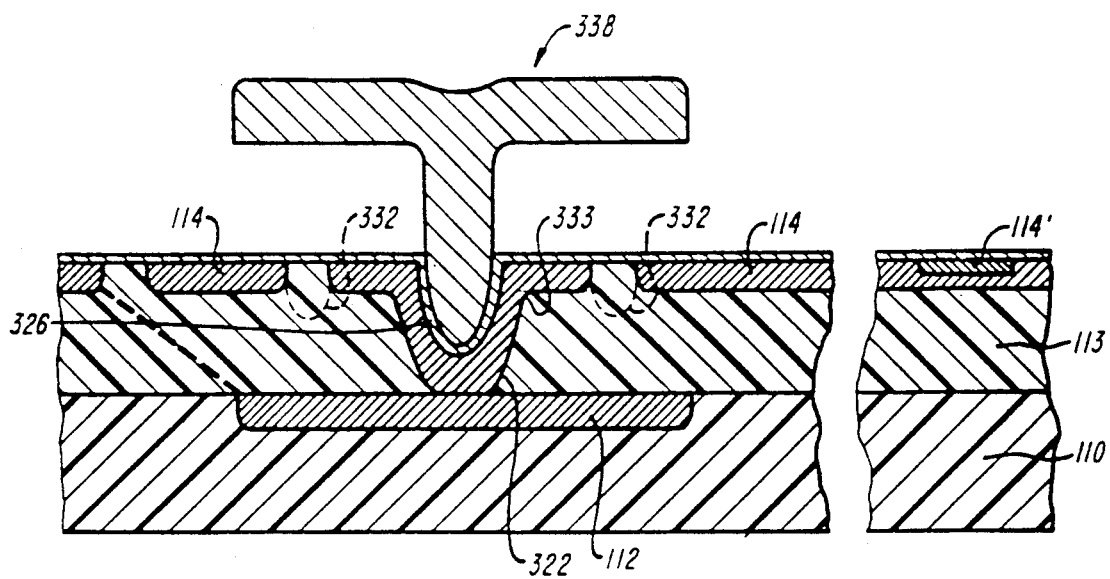
FIG. 4 illustrates a variation on the embodiment of FIGS. 3A and 3B having an narrow annular gap for lateral restraint.

In another preferred embodiment, as shown in FIG. 4, lateral movement of the plate 114 can be further restricted by forming a narrow annular gap 332 between a lip 333 on the stalk 322 and the resiliently supported plate 114. To form the narrow gap 332, the doping for the plate 114 and a pit 326 is formed without regard to the holes 332 as before. The narrow annular gap 332 is formed by etching a concentric aperture about the pit 326 through the doping for the plate 114 and into the undoped region of epitaxial silicon layer 113, using well-known plasma etching techniques. To create a cap 338, the second general process for fabricating a thick metallization layer spaced from an underlying silicon layer is used, as before.

Figure 5:
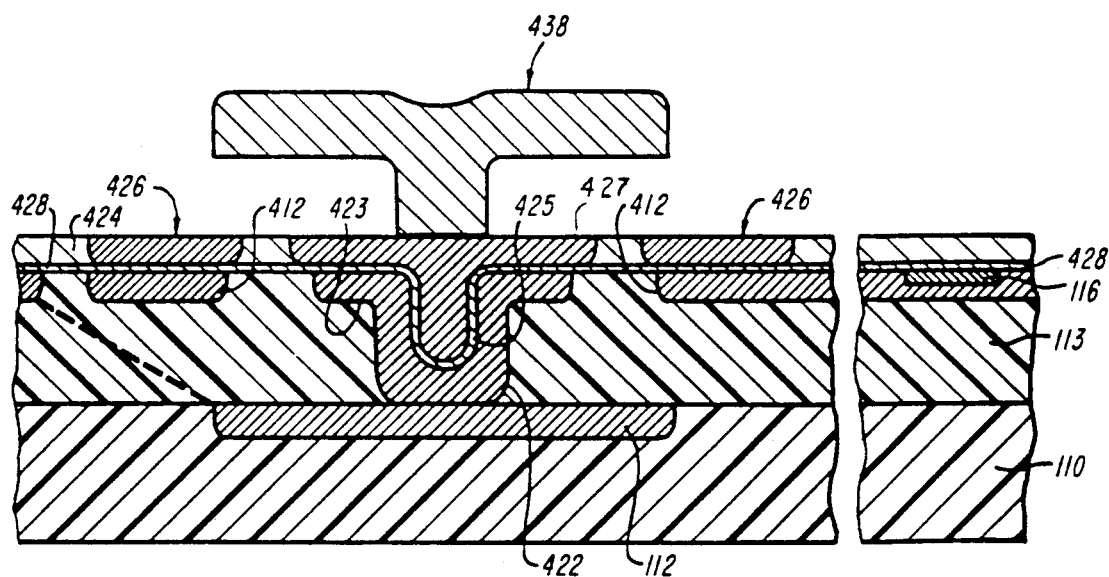
FIG. 5 illustrates a further embodiment having resilient metal-to-metal contact surfaces at all points of contact.

In a further embodiment, as shown in FIG. 5, both lateral and vertical movement of the resiliently supported plate 114 is limited by all metal contacting faces to provide a softer interface. An annular metal ring 426 is formed in a resiliently supported plate 114 and concentrically surrounds a central metal disk 427 that is formed upon a top surface 423 of a stalk 422. Lateral movement of the plate 114 is limited by contact of the metal ring 426 with the metal disk 427. Vertical movement of the plate 114 is limited by contact of the metal ring 426 with a metal cap 438 on the stalk 422.

To fabricate the embodiment shown in FIG. 5, the boron diffusion for plate 114 is formed with an annular gap 412 and stalk 422 as described above using photolithographic processes.

To create the central metal disk 427, the concentric metal ring 426, and the cap 438, the second general process described above for the formation of a metal layer over a silicon substrate is used.

Motion restraints are also applied to gyroscope transducers formed as micromechanical devices. A micromechanical gyroscope is described in the above identified application (Ser. No. 07/143,515) and is shown in FIGS. 6A and 6B. Such a gyroscope includes a dual gimbal system, an inner resiliently supported gimbal plate 502, having a mass 504 such as gold plated onto a silicon backfilled pit as described therein. The gimbal plate 502 is resiliently and rotationally supported by flexures 506 within an outer gimbal plate 508 which is in turn resiliently supported for rotation from a substrate 510 by flexures 512. Outer gimbal plate 508 is vibrationally driven about axis 514 and inner gimbal plate 502 vibrationally responds to inertial input by rotating about axis 516.

The outer gimbal plate 508 is restrained by stops 518 and 520 which comprise generally triangular integral protrusions 522 from the sides of plates 508 and metal platings 524 formed according to the second general process described above.

Similar stops 526 and 528 having protrusions 522 and metal stops 524 restrain the inner gimbal plate 502 within limits within outer gimbal plate 508. Due to the complex motion possible at stops 526 and 528 the stalk form of stops is less preferred.

FIG. 7 illustrates another embodiment in which a plate 602, resiliently supported within a substrate 604, has an aperture 606 in which a silicon plug 608 is supported by a metal bridge to the substrate 604. The plug 608 is formed as an isolated diffusion separated from the plate 602 and formed during the same diffusion as plate 602 or, to achieve greater depth, separately. The bridge 610 is formed using the second general process for metallization described above.

In lieu of locating the stops at the outer periphery of the moving elements, it may be desireable to locate them more proximate to the flexures. While this permits a greater range of motion, it also increases the flexures restoration torque at the point of contact. The higher torque is potentially effective to overcome any residual sticking encountered.

Other modifications and additions will occur to those skilled in the art that are nevertheless within the spirit and scope of the invention as claimed.

What is claimed is:

1. A system of restraints for use with a micromechanical transducer comprising:
   a moveable transducer element flexibly supported within a recess of a semiconductor substrate;
   at least one thick metal layer region deposited over a region of plural thin metal layers, disposed at one or more positions about said recess, fixed to said semiconductor substrate, and extending towards said element so as to prevent displacement of said transducer element beyond a predetermined limit, wherein said thick metal layer region extends from the surface of said semiconductor substrate over said moveable transducer element; and
   a stalk supporting said thick metal layer region and extending from a portion of said substrate through an aperture in said transducer element.

2. The system of claim 1, wherein said thick metal layer region is of a diameter greater than said aperture.

3. The system of claim 1 wherein said transducer element or substrate has a non-stick material bonded to a surface that confronts said thick metal layer region.

4. The system of claim 1 wherein said stalk includes an annular portion radially extending toward the boundary of an aperture in said transducer element, together adapted to limit lateral displacement of said element.

5. The system of claim 1 wherein said transducer element and stalk include metallizations adapted to provide metal-to-metal limits to the lateral and rotational displacement of said transducer element.

6. The system of claim 1 wherein said transducer element is adapted to provide acceleration sensitive displacement.

7. The system of claim 1 wherein said transducer element further comprises first and second gimbal plates and a first set of metallizations from said substrate extending over said first gimbal plate and a second set between said first and second gimbal plates to restrain motion of said second gimbal plate relative to said first gimbal plate.

8. The system of claim 7 wherein said second set includes a metallization bridge between one of said gimbal plates and a plug in a hole of the other plate to provide rotational and translational restraint.

* * * * *

UNITED STATES PATENT AND TRADEMARK OFFICE
CERTIFICATE OF CORRECTION

PATENT NO. : 5,111,693

DATED : May 12, 1992

INVENTOR(S) : Paul Greiff

It is certified that error appears in the above-identified patent and that said Letters Patent is hereby corrected as shown below:

Column 1, line 12, delete the second occurrence of, "07/479,854 filed February 14, 1990, which is a continuation-in-part of Ser. No." which appears twice.

Column 2, line 18, "FIGS. 3A and 3B having an narrow" should read --FIGS. 3A and 3B having a narrow--.

Column 3, line 54, "away the uncovered oxidized surface, etching the exposed photoresist" should read --away the exposed photoresist, etching the uncovered oxidized surface--.

Column 3, line 65, "separate second diffusion step, and" should read --separate second diffusion step,--.

Column 3, line 66, "one tenth as deep as the for the" should read --one tenth as deep as the--.

Column 4, line 60, "support cap 39" should read --support cap 239--.

UNITED STATES PATENT AND TRADEMARK OFFICE
CERTIFICATE OF CORRECTION

PATENT NO. : 5,111,693
DATED : May 12, 1992
INVENTOR(S) : Paul Greiff

It is certified that error appears in the above-identified patent and that said Letters Patent is hereby corrected as shown below:

Column 4, line 61, "The cap 238 is formed" should read --The cap 239 is formed--.

Column 4, line 63, "layer 239 spaced from" should read --layer 238 spaced from--.

Column 5, line 10, "236 to resist" should read --235 to resist--.

Signed and Sealed this

First Day of February, 1994

BRUCE LEHMAN

Attest:

Attesting Officer

Commissioner of Patents and Trademarks